United States Patent [19]

Janning

[11] Patent Number: 4,667,217

[45] Date of Patent: May 19, 1987

[54] TWO BIT VERTICALLY/HORIZONTALLY INTEGRATED MEMORY CELL

[75] Inventor: John L. Janning, Dayton, Ohio

[73] Assignee: NCR Corporation, Dayton, Ohio

[21] Appl. No.: 725,039

[22] Filed: Apr. 19, 1985

[51] Int. Cl.[4] .................. H01L 27/12; H01L 29/78; H01L 29/04; H01L 29/34

[52] U.S. Cl. .................................... 357/54; 357/4; 357/23.1; 357/23.5; 357/23.7; 357/41; 357/59; 365/184

[58] Field of Search .................. 357/2, 4, 23.1, 23.5, 357/23.7, 41, 54, 59 E; 365/184

[56] References Cited

U.S. PATENT DOCUMENTS

| | | | |
|---|---|---|---|
| 4,258,378 | 3/1981 | Wall. | |
| 4,385,308 | 5/1983 | Uchida | 357/41 |
| 4,420,871 | 12/1983 | Scheibe | 357/23.5 |
| 4,554,570 | 11/1985 | Jastrzebski | 357/4 |

FOREIGN PATENT DOCUMENTS

| | | | |
|---|---|---|---|
| 52-63686 | 5/1977 | Japan | 357/23.5 |
| 55-56662 | 4/1980 | Japan | 357/23.1 |
| 58-54668 | 3/1983 | Japan | 357/23.5 |
| 58-154273 | 9/1983 | Japan | 357/23.5 |
| 2066566 | 7/1981 | United Kingdom | 357/2 |

OTHER PUBLICATIONS

Chen et al., "Stacked CMOS SRAM Cell", *IEEE Electron Device Letters*, vol. EDL-4, No. 8, (Aug. 1983) pp. 272-274.

Kawamura et al., "Three-Dimensional CMOS IC's Fabricated by Using Beam Recrystallization", *IEEE Electron Device Letters*, vol. EDL-4, No. 10, (Oct. 1983) pp. 366-368.

Gibbons et al., "Stacked MOSFET's in a Single Film of Laser-Recrystallized Polysilicon", *IEEE Electron Device Letters*, vol. EDL-3, No. 8, (Aug. 1982) pp. 191-193.

*Primary Examiner*—J. Carroll
*Attorney, Agent, or Firm*—Wilbert Hawk, Jr.; Casimer K. Salys

[57] ABSTRACT

A bit selectable, two bit per cell memory device using stacked or side-by-side fixed threshold and alterable threshold transistors. The alterable threshold transistors are used both as a switch to select the desired device or memory bank and also as a memory element. Selection between the code represented by the fixed threshold transistors and the code represented by the alterable threshold transistors is prescribed by block erase or block write cycles.

13 Claims, 11 Drawing Figures

TWO BIT VERTICALLY/HORIZONTALLY INTEGRATED MEMORY CELL

BACKGROUND OF THE INVENTION

The present invention relates to metal oxide semiconductor (MOS), silicon-on-insulator (SOI) and metal-nitride-oxide semiconductor (MNOS/SNOS) technologies, and to memory cells and arrays which incorporate two bits of information per cell. In particular, the invention involves both vertically integrated (stacked) structures and shared active region structures which combine fixed threshold transistors and alterable threshold, non-volatile (NV) memory transistors into a two bit/cell structure in which selection from the two bits is made by writing or erasing the NV memory transistor. This approach has application, for example, to memory arrays such as ROM arrays, where it permits a single ROM array to function electrically as two separate arrays. The arrays are selected by a write/erase operation.

Two of the critical continuing needs of the microelectronics industry are to increase device packing densities and to enhance performance characteristics such as the speed of operation. The ongoing attempts to scale device sizes and associated structures has been successful to date in reducing the size and increasing the density of monolithic integrated circuits, albeit with some problems such as short channel effects.

Recently, another approach has emerged for increasing device density in the form of MOS vertical integration using devices which are stacked one above the other. This approach has significant potential for increased device packing density. In addition, in CMOS technology, the stacked structure eliminates isolation wells, decreases latchup, and provides decreased wire routing complexity. An example of a stacked CMOS inverter configuration is described in Colinge et al., *Stacked Transistors CMOS (ST-MOS), an NMOS Technology Modified to CMOS*, IEEE Transactions on Electron Devices, Vol. ED-29, pp. 585–589 (1982). Referring to FIG. 1, the Colinge et al. structure starts with a conventional NMOS structure formed in a silicon substrate 10, uses the NMOS gate 11 for both transistors, and adds a selectively implanted, laser-recrystallized polycrystalline silicon layer 12 which forms the PMOS source/drain (S/D) regions 13 and 15 together with intermediate channel region 14. The PMOS S/D 15 is formed in contact with NMOS S/D 16 to provide electrical interconnection for the stacked inverter.

Another stacked CMOS structure which also uses a single common gate and recrystallized polysilicon for the PMOS source/channel/drain is described in Chen et al., *Stacked CMOS SRAM Cell*, IEEE Electron Device Letters, Vol. 4, p. 272 (1983).

Still another stacked CMOS configuration is described in Kawamura et al., *Three-Dimensional CMOS IC's Fabricated By Using Beam Recrystallization*, IEEE Electron Device Letters, Vol. 4, p. 366 (1983). This approach forms two "upright" NMOS and PMOS transistors using separate gates as well as separate source/drain diffusions. The lower NMOS device is formed using standard silicon technology, then a composite phosphosilicate glass (PSG)-nitride composite insulation is formed over the PMOS device. The NMOS transistor is then formed over the PMOS transistor by depositing a second layer of polysilicon which is recrystallized and selectively doped to form the NMOS source/channel/drain, then depositing and forming a third layer of poly onto the NMOS gate.

Combined vertical and horizontal integration is described in Gibbons et al, *Stacked MOSFETs in a Single Film of Laser-Recrystallized Polysilicon*, IEEE Electron Device Letters, Vol. 3, p. 191 (1982). Here, two transistors are provided in a cross-shaped single gate configuration. The paired opposite ends of the cross form the source/drain of the two transistors. The gates are located at the crossing of the two transistor channels, where the upper and lower surfaces of the polysilicon layer serve as the gates for the two transistors.

In short, the above techniques apply polysilicon recrystallization to increase the density and/or enhance operation characteristics of MOS/CMOS transistors.

The only stacked, nonvolatile, alterable threshold structure of which I am aware is described in my commonly assigned U.S. Pat. No. 4,619,034. That application utilizes laser recrystallization of polysilicon to permit the formation of an inverted memory transistor which comprises from top to bottom, channel-oxide-nitride-silicon gate electrode-insulator. The nitride is formed before the oxide, which permits forming the oxide by conversion of the nitride. The conversion process provides exceptional quality and precise, controllable reproducible growth rates for the very thin (approximately 20 Angstroms thick) memory silicon oxide.

My above co-pending application discloses, but does not specifically depict, a common gate, vertically stacked nonvolatile memory device pair. The actual construction of such a device is shown in FIG. 2. The device comprises a piggyback configuration of a standard SNOS trigate NVAT memory structure 20 and an overlying stacked SOI NVAT memory gate structure 25. The trigate structure is formed conventionally on silicon substrate 21 using source/drain diffusions 22, polysilicon gate 23 and a composite memory gate dielectric 24. The dielectric includes a layer of oxide 24OX which is formed to the three-section, trigate source- and drain-protected configuration (which is described in commonly assigned Naber et al., U.S. Pat. No. 3,719,866) and an overlying charge-storage silicon nitride layer 24NI. The disclosed SOI transistor 25 also has a trigate configuration. The device 25 is configured with the common polysilicon gate 23, overlying nitride 26NI, and the trigate oxide 26OX. A recrystallized selectively doped second polysilicon layer forms the source and drain 27 and the channel 28 for the SOI memory device 25. Layer 29 is an insulator such as silicon dioxide. As mentioned previously, a key aspect of the SOI structure 25 is the ability to form the memory gate oxide, here designated 26M, by conversion of the upper surface of the nitride 26NI. In addition, the stacked piggyback device configuration provides the potential for increased device density without the need for separate gates (and the attendant separate on/off and separate write/erase operations).

In view of the above discussion, it is one object of the present invention to extend the above-described, three-dimensional stacked SOI and MNOS structural approach to a plural bit, bit-selectable memory structure which uses an Erase/Write sequence to select the bit which is to be read. It is a corollary object of the present invention to extend the plural bit, bit selectable concept to memory arrays, such as read only memories (ROMs), for example, to a bank-selectable two ROM memory array which is incorporated in the physical space of a single ROM array.

BRIEF SUMMARY

In accordance with one aspect of the present invention, the bit-selectable, two bit per cell memory device of the present invention comprises a non-volatile, alterable threshold memory device which shares a gate electrode structure in common with a fixed threshold device. The word "device" as used here and throughout the present patent document includes conventional field effect transistors as well as gate structures such as gated capacitive devices which may be devoid of source and/or drain. Thus, the channel region of the nonvolatile, alterable threshold memory device may comprise a source-channel-drain structure or simply a channel/electrode. The new memory device includes a charge storage memory gate structure which includes a gate electrode, and a gate dielectric formed between the gate electrode and the channel, such that the memory device can be written to first and second, low voltage and high voltage threshold states. The non-memory, fixed threshold device is formed either in stacked relationship with the memory device (in which case the two devices share a common recrystallized polychannel or a common gate electrode), or in side-by-side relationship to the memory device (in which case the two devices share the same active region and can have an electrically common gate electrode structure and common source/drain regions). In addition, the fixed threshold device is fabricated to have a threshold voltage which is intermediate the low (erased) and high (written) states of the NV, alterable threshold memory device.

With this configuration and choice of threshold voltages, the logic state of the NV alterable threshold memory device can be determined by applying an Erase sequence to the NV alterable threshold memory device, followed by the application of a Read voltage the magnitude of which is between the erased threshold voltage (VT0) of the NV alterable threshold memory device and the threshold voltage of the fixed threshold device.

Similarly, the logic state of the fixed threshold voltage device is read by applying a Write sequence to the NV alterable threshold memory device, followed by the application of a Read voltage the magnitude of which is between the threshold voltage of the fixed threshold device and the written threshold voltage (VT1) of the NV alterable threshold memory device.

Those with skill in the art will appreciate that in standard ROM programming, a logic "1" or "0" is provided at a particular ROM device address by manufacturing or programming the device to be inoperable/operable. Typically, devices are rendered inoperable by the use of very heavy implants or thick gate oxide to elevate the device threshold voltage well above the operating voltage range for the particular integrated circuit. The present memory structure uses this standard inoperable/operable programming to provide logic 0/1 states. Thus, regardless of which logic 0/1 state the memory and non-memory transistors are in, application of the Erase plus Read sequence or the Write plus Read sequence selects for reading the memory or the non-memory device (or array), respectively, to the extent that 0/1 logic data has been programmed therein.

In other aspects, the two bit per device construction of the present invention can be implemented in various combinations of SOI, MNOS (MNOS includes SNOS), and MOS (MOS includes SOS) configurations.

DETAILED DESCRIPTION

Figure 1:
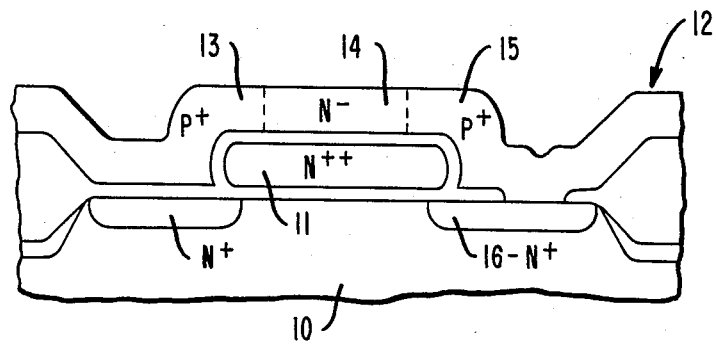
FIG. 1 is a schematic cross-sectional representation through one portion of a prior art, stacked CMOS integrated circuit.
Figure 2:
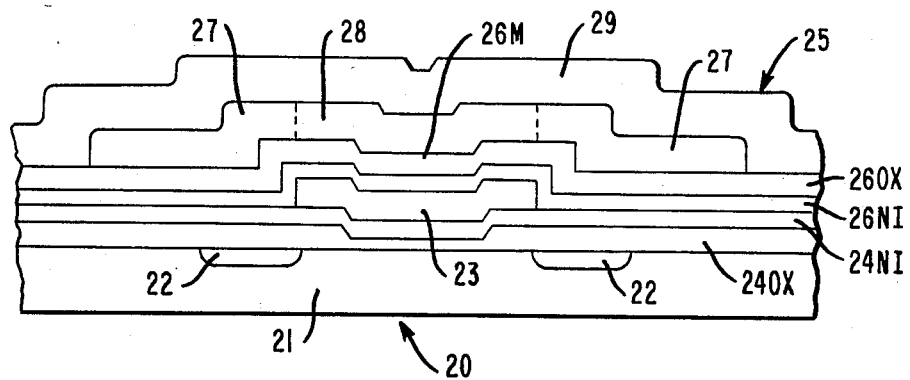
FIG. 2 is a schematic cross-sectional representation through one portion of a proposed stacked integrated circuit in having two nonvolatile SNOS transistors.
Figure 3:
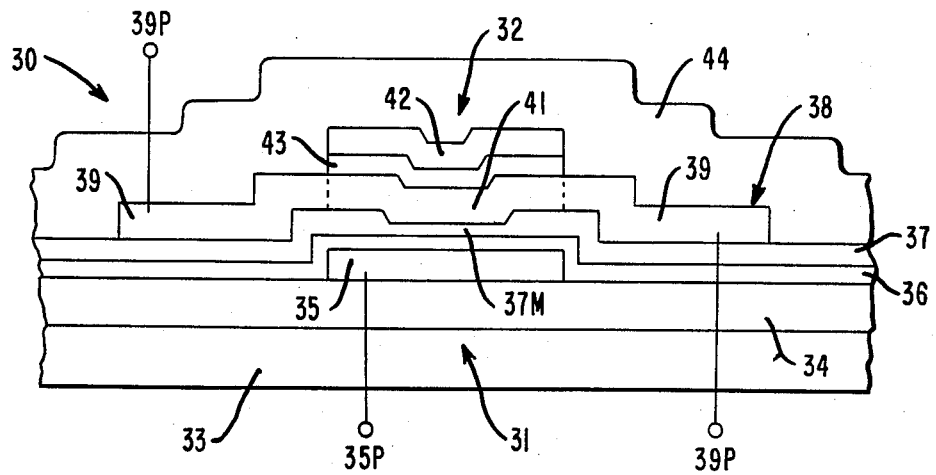
FIGS. 3 and 4 are schematic cross-sectional representations through portions of respective stacked integrated circuit structures which are alternative embodiments of the present invention.

Referring to FIG. 3, there is shown a first embodiment 30 of my twobit per cell structure in the form of an inverted, NVAT (non-volatile, alterable threshold) SOI memory transistor 31 and an overlying fixed threshold transistor 32. The transistors 31 and 32 have a common recrystallized polysilicon source-channel-drain structure. Specifically, the SOI NVAT memory transistor 31 is constructed in accordance with the SOI structure and fabrication sequence which are described in detail in U.S. Pat. No. 4,619,034. The SOI structure (not to be confused with the SNOS structure 20 of FIG. 2) includes a silicon substrate 33, an insulator dielectric layer 34, and the inverted trigate memory configuration including polysilicon gate electrode 35 (poly I), nitride layer 36, oxide layer 37 and the recrystallized polysilicon layer 38 (poly II) which forms the source and drain 39—39 and channel region 41. The fixed threshold transistor 32 comprises the gate electrode 42 which is formed from a third layer of polysilicon (poly III), gate oxide layer 43 and the underlying source 39-channel 41-drain 39 which is common to device 31 as well.

The trigate SOI configuration of device 31 includes a very thin memory oxide section 37M (about 1–4 nanometers) formed central to the channel and the thicker sections 37 which flank memory oxide 37M at the source and drain sides thereof to eliminate the instabilities and threshold shifts described in the above-mentioned trigate patent, U.S. Pat. No. 3,719,866. U.S. Pat. No. 3,719,866 is incorporated by reference. Those with skill in the art will appreciate that while the trigate construction is preferred, dual gate and monogate constructions can be used in some applications. In the dual gate configuration, a single thick oxide region 37 is formed over the source or drain whereas the thick source/drain sections 37 are not used in the monogate configuration.

In fabricating the device 30, the starting material is a wafer or substrate 33 of material having a low coefficient of thermal expansion which is comparable to that of the dielectric material such as silicon dioxide or silicon nitride which is used in the device. Suitable materials include silicon, high temperature glass, and ceramics such as alumina (aluminum oxide). Insulator 34 electrically isolates the memory device from the substrate 33 and the peripheral circuitry and typically comprises silicon dioxide (or silicon nitride) formed to a thickness of about 1,000 nanometers by chemical vapor deposition or, where the substrate 33 is silicon, by high temperature oxidation of the silicon.

Next, the first layer of polysilicon (poly I) is formed about 300 nanometers thick by conventional process techniques such as low pressure chemical vapor deposition (LPCVD) followed by delineation and patterning using conventional photolithographic and etching techniques to form the gate electrode 35. The polysilicon gate electrode can be doped in situ or by subsequent ion implantation.

Next, the nitride layer 36 is conformally deposited to a thickness of about 40 nanometers using a conventional LPCVD (silane/ammonia system; 750° C.; 400 mT) operation, followed by deposition of the oxide layer 37 to a thickness of about 70-80 nanometers using low temperature LPCVD (silane/oxygen system; 420° C.; 300 mT) operation. Thereafter, the central memory oxide section is removed using conventional photolithographic and etching techniques, and a new oxide is thermally grown or deposited to ensure that section 37 M has thickness of about 1-4 nanometers. Suitable techniques include chemical vapor deposition, or conversion of the exposed region of nitride 36 by oxidation (wet oxygen; 1000° C.; 30 minutes) into the oxide section 37 M.

Immediately after forming the memory oxide 37 M, and to avoid contamination of the memory oxide 37, a second polysilicon layer 38 (polysilicon II) is formed to a thickness of about 450-500 nanometers, again using conventional techniques such as LPCVD. The poly II layer 38 is then lightly doped by ion implantation (for example, with boron at 35 keV and a dose of 1E1-2-2E13 ions/sq cm.) to provide the requisite channel conductivity. The poly II layer 38 is then capped with an anti-reflective coating of nitride (not shown) which is formed about 40-45 nanometers thick by conventional processing such as LPCVD. Next, the poly II layer 38 is exposed to a laser beam (for example, a continuous wave argon laser having an effective beam diameter of 45 micrometers, a beam power of 5 watts, and a scanning speed 200 cm per/sec.) to convert the polysilicon to device-quality material comprising a re-crystallized matrix of crystallites having various crystal orientations. The nitride cap (not shown) is then removed using concentrated hydrofluoric acid and the recrystallized poly II layer is patterned to the source 39-channel 41-drain-39 configuration shown if FIG. 3.

Next, the fixed threshold transistor 32 is formed by depositing an oxide layer 43 to a typical thickness of 50 nanometers. A silane/oxygen LPCVD technique of the type described previously can be used here as well. Subsequently, the polysilicon gate 42 layer (poly III) is formed, typically to a thickness of approximately 300 nanometers using the same formation technique (LPCVD) and the same implantation doping techniques described relative to poly gate electrode 35. The structure is photolithographically processed to mask polysilicon gate 42 so that successive etching of gate 42 and oxide 43 provides for self-aligned implanting of source and drain regions 39—39 with n-type impurity.

After removal of the implant mask, a low temperature oxide layer 44 about 900-1,000 nanometers thick is blanket deposited over the structure and is densified at a temperature of about 900° C. in nitrogen. The densification step is also used to activate the ions implanted in the source and drain regions. Thereafter, the device can be completed, for example, by making contact cuts to the source and drain 39—39 through the oxide 44, followed by contact enhancement using phosphorus oxychloride (POCl$_3$) deposition and thermal diffusion, followed by metalization and the formation of a passivation layer.

The cell 30 shown in FIG.3 is thus a non-alterable-over-an-alterable transistor configuration with a common source/channel/drain structure. One of the key aspects of this design and the associated operation is the dual function of the SOI nonvolatile alterable threshold device 31. That is, device 31 acts first as a switch to select between the alterable threshold device 31 and the fixed threshold device 32 for reading and, secondly, functions as a memory location to provide a logic 0/1 output.

For purposes of programming binary states into the nonvolatile alterable threshold device, the threshold voltages of the transistor 31 is conveniently adjusted to an inoperatively high threshold (logic 0) or to an operative threshold (logic 1) by adjusting the gate oxide thickness or by implantation. The same is true for programming the binary state represented by fixed threshold device 32. Also, the nonvolatile alterable threshold devices 31 selected to potentially represent the logic 1 state are adjusted by implant to provide an erased threshold voltage of −1 volt (VT0) and a written threshold voltage of +4 volts (VT1). Using these examples of VT0/VT1 threshold voltage levels and an operative fixed threshold device with a +1 volt threshold, two bits of information can be obtained from the single cell 30 by a simple addressing scheme, which is summarized in Table 1. The addressing approach assumes that logic 1/0 for each device 31 and 32 is determined by an operative/inoperative device at that location.

TABLE 1

| ERASE/WRITE PROGRAM | (VT$_f$ = +1 V) READ VOLTAGE | DEVICE SELECTED |
|---|---|---|
| VT0 (−1 V) | 0 V | NV Alterable Threshold FET 31 |
| VT1 (−4 V) | +2 V | Fixed Threshold FET 32 |

Referring to Table 1, the first sequence is designed to select the alterable threshold transistor 31 for reading and involves (a) an Erase operation which is designed to write the memory transistor 31 (if operative) to a low threshold, VT0 state, followed by (b) a sense operation using a 0 volt Read voltage. (The Read voltage is keyed to the above-mentioned threshold voltages of VT0=−1 volt; fixed threshold FET Threshold of VT$_f$=+1 volts; VT1=+4 volts). Using this Erase plus 0 volt Read sequence, if the device 31 is (VT0=−1 volt), the device 31 conducts current, and this can be sensed as logic 1 by a standard sensing amplifier circuit. If, however, there is no operative device at that location, cell 30 does not conduct current, which is sensed as logic 0 at the cell 30 address. Note that with VT$_f$ at +1/volt, no conduction would be sensed even if gates electrodes 35 and 42 were made common.

Conversely, and referring further to Table 1, the fixed threshold transistor 32 location is selected by the application of (a) a Write program operation which is designed to write the alterable threshold memory transistor 31 to the high, VT1 threshold state, followed by (b) a Read voltage such as +2 volts, which voltage lies between $VT_f$ and VT1. Using this Write plus +2 volt Read sequence, the alterable threshold transistor 31 does not conduct current. (The binary state of the two transistor cell 30 is determined by whether or not transistor 31 is operative.) Logic 1/0 is then determined by the existence/nonexistence at the particular address location of an operative fixed threshold transistor 32 having a +4 volt threshold voltage.

As will be known to those familiar with the nonvolatile alterable threshold device technology, the transistor 31 is erased to VT0, for example, by applying a large (20-25 volts; 1-100 ms pulse duration) negative program voltage to the gate electrode 35 with respect to the channel to drive to the channel electrons which are trapped in the gate dielectric at the oxide-nitride interface and in the nitride bulk. Conversely, the transistor 31 is written to the high threshold, VT1 state, by applying a large (20-25 volts; 1-100 ms pulse width) positive program voltage between the gate 35 and the channel (with the source and drain being maintained at ground potential) to tunnel electrons into the gate dielectric for storage. Electrode connections for writing and erasing the transistor 31 are illustrated schematically at 35P and 39P, FIG. 3. Of course, the other NV alterable threshold devices described herein are written/erased similarly.

Figure 4:
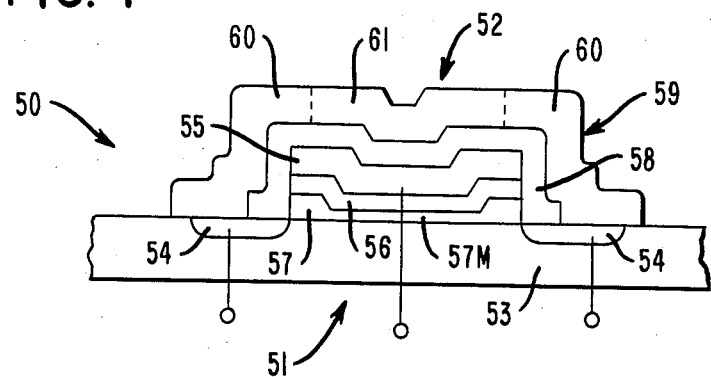

Another version 50 of the alterable threshold transistor-fixed threshold transistor cell is shown in FIG. 4, in the form of a trigate SNOS transistor 51 having an upside down SOI fixed threshold transistor 52 formed thereon. This SNOS/SOI cell 50 is configured with a single gate electrode 55 and separate source-channel-drain structures.

Typically the SNOS alterable threshold device 51 is formed using a <100> silicon substrate 53. The trigate dielectric comprises trigate memory oxide 57 and silicon nitride layer 56. The silicon dioxide layer can be formed to a thickness of about 70-80 nanometers using, for example, the same process which is used to form the memory silicon dioxide 37, FIG. 3 The oxide is then selectively removed from the central, memory region, for example, by etching with buffered hydrofluoric acid, and the memory oxide 57M is grown or deposited to a thickness of about 1-4 nanometers. This memory oxide layer can be grown by dry thermal oxidation of the silicon substrate, or can be formed on the substrate 53 by chemical vapor deposition using the same process that was used for the oxide layer 57. After forming the gate oxide 57M, the silicon nitride layer 56 is deposited to a thickness of about 40 nanometers by conventional LPCVD. The polysilicon gate electrode 55 is then formed to a thickness of about 300 nanometers, typically using the same process which was used to deposit, delineate, pattern, and implant the gate 42 of FIG. 3.

As shown in FIG. 4, the oxide 57 and nitride 56 are removed from the regions outside the gate region. This can be done prior to the gate implant, using the same etching mask which is used to delineate and pattern the gate 55, or separately after the gate implant.

Next, the polysilicon electrode 55 is used as an implant mask and the source and drain 54-54 are formed self-aligned with the gate 55. This completes the SNOS device 51.

Next, the gate silicon dioxide layer 58 for the SOI fixed threshold device 52 can be formed to a thickness of about 50-55 nanometers using the same process which was used to form the fixed threshold oxide 43 of device 32, FIG. 3. A polysilicon layer 59 (polysilicon II) is formed over the existing structure and is recrystallized using a laser beam as described previously for poly layer 38 (FIG. 3).

Next, the source 60-channel 61-drain 60 for the fixed threshold device 52 is selectively implanted. The same formation, patterning, recrystallization and implant technique that was used for the recrystallized poly layer 38 of FIG. 3, can be used. The cell 50 is then completed, for example, by forming and densifying an intermediate silicon dioxide isolation layer, making contact cuts, and defining metalization, followed by the application of a passivation layer. Here, the contacts are made to the single polysilicon gate electrode 55 and to source/drain electrodes 54.

Figure 5:
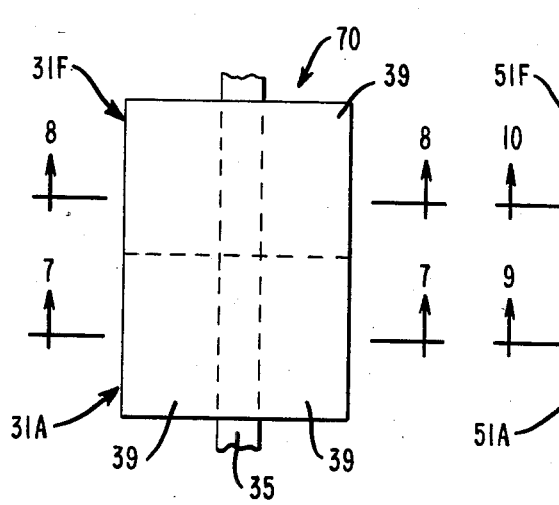
FIGS. 5 and 6 are schematic plan view outlines of shared active region integrated circuit structures which are alternative embodiments of the present invention.
Figure 6:
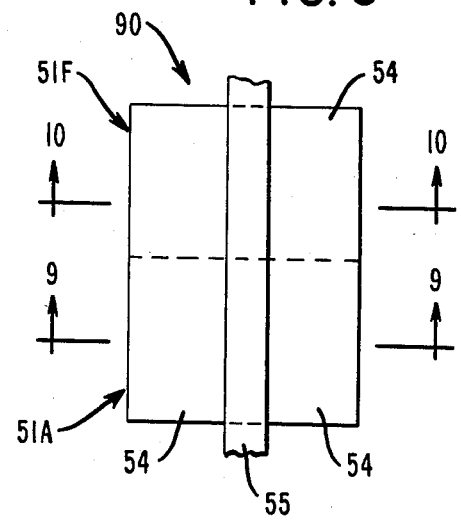

Two additional alternative versions 70 and 90 of the two bit/cell structure are shown in schematic top views, in FIGS. 5 and 6, respectively. The two bit/cell 70 of FIG. 5 contains NV alterable threshold device 31A and fixed threshold device 31F. The MOS/MNOS two bit/cell 90 of FIG. 6 contains NV alterable threshold device 51A and fixed threshold device 51F. It should be noted that devices 31A and 31F are similar to device 31 of FIG. 3 and devices 51A and 51F are similar to device 51 of FIG. 4, except that, preferably, devices 31F and 51F do not use a nitride layer such as 36 (FIG. 3) or 56 (FIG. 4).

Accordingly, device components in transistors 31A or 31F (FIGS. 5, 7, 8) and transistors 51A or 51F (FIGS. 6, 9, 10) which are identical to those for devices 31 (FIG. 3) and 51 (FIG. 4) are designated by the same reference numerals used for devices 31 and 51. Modified components are indicated by the respective suffix A or F in transistors 31A or 31F and 51A or 51F. In each cell, the fixed threshold transistors 31F or 51F and the alterable threshold transistor 31A or 51A are formed side-by-side in a common active area 39 of the integrated circuit. In each cell 70 or 90, the source (and the drain) 39 or 54, respectively, of both devices is part of the same diffusion region or is connected in common. Also, the same gate line (or an electrically common gate line) serves both devices of the cell. The operation of the cells 70 and 90 is identical to that of devices 30 and 50, described above.

Figure 7:
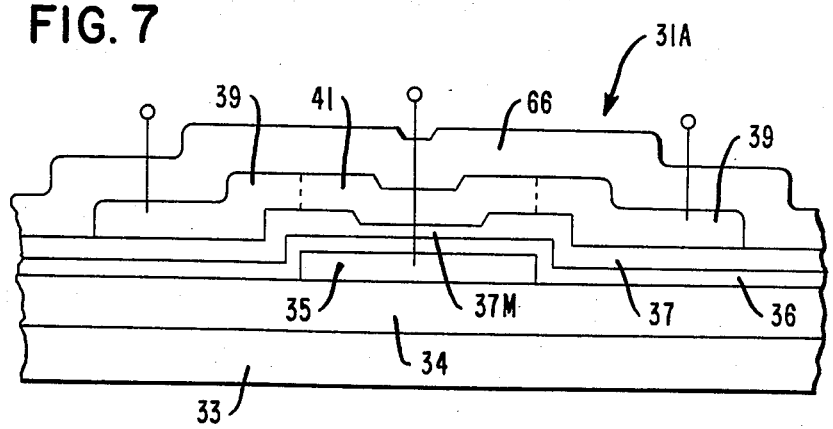
FIGS. 7 and 8 are cross-sections taken along the lines 7—7 and 8—8 through devices in FIG. 5.
Figure 8:
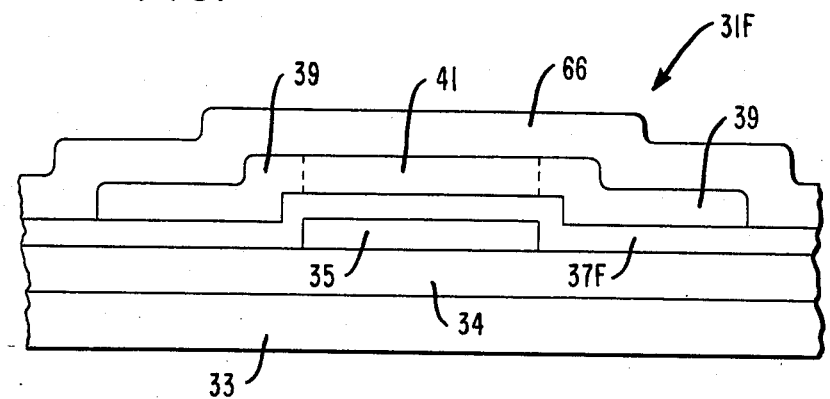

Referring now to FIG. 7 in addition to FIG. 5, the NV alterable threshold transistor 31A of cell 70 has the same construction as the NV alterable transistor 31 of FIG. 3. Similarly, and referring to FIG. 8 in addition to FIG. 5, the fixed threshold transistor 31F preferably has the same construction as transistor 31 of FIG. 3, with the exception that the gate oxide 37F of fixed threshold device 31F is of a uniform non-memory thickness and the gate nitride is omitted.

The basic fabrication sequence for the upside down device 31A was described for the corresponding device 31 of FIG. 3. The fixed threshold device 31F and the memory device 31A can be formed using a sequence in which the nitride 36 is formed everywhere then removed from the non-memory device areas 31F; the non-memory oxide 37F is formed everywhere; then the non-memory oxide is etched away in the memory regions of devices 31A, and memory oxide 37M is grown.

Figure 9:
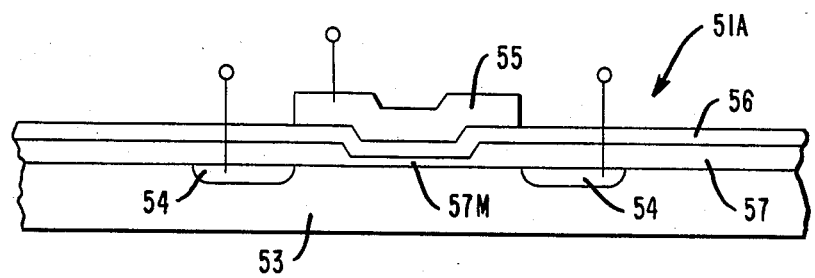
FIGS. 9 and 10 are cross-sections taken along lines 9—9 and 10—10, respectively, through devices in FIG. 6.

Considering now the side-by-side cell 90 of FIG. 6, the alterable threshold device 51A shown in FIGS. 6 and 9 can have the same SNOS construction as the alterable threshold device 51 of FIG. 4. Although the fixed threshold device 51F shown in FIGS. 6 and 10 can have essentially the same SNOS construction as the transistors 51 (with the exception that the threshold of device 51F is non-alterable).

Figure 10:
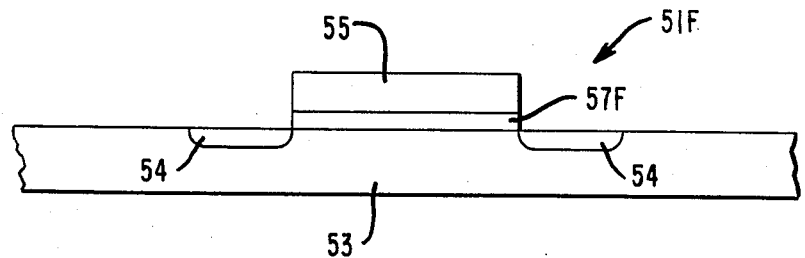

The basic fabrication sequence for the alterable threshold device 51 of FIG. 4 can be used to form the alterable threshold device 31A of FIG. 9 and the fixed threshold device 51F of FIG. 10. The dielectric sequence is basically the reverse of that used for side-by-side devices 31A and 31F, described above. First, the non-memory oxide 57F is formed everywhere; then the non-memory oxide is etched away in the memory regions of the devices 51A and the memory oxide 57M is grown there; and the nitride 56 is deposited everywhere, then removed from the non-memory device areas 51F.

The cells 30, 50, 70, and 90 can be formed into a memory pattern such as a ROM (read-only memory) array, as alluded to previously. Consider now such a dual ROM array built with the piggyback devices 30 (FIG. 3), or 50 (FIG. 4), or the side-by-side devices 70 (FIG. 5), or 90 (FIG. 6), in which each ROM array forms a separate pattern, such as a ROM pattern used to effect a different ROM code. For example, the channels of the alterable threshold transistors can be implanted selectively in the particular 1/0 pattern of a code 1 in which the operable logic 1 devices can be electrically written to either VT0 or VT1, whereas the logic 0 device sites are programmed to inoperatively high threshold voltages. Likewise, the fixed threshold voltage transistors are programmed to the particular 1/0 pattern of a code 2, in which the fixed threshold voltage is +4 volts/inoperative. Then, by applying a block ERASE sequence to the array of alterable threshold devices and addressing the array with 0 volts the ROM is selected to code pattern 1. When code pattern 2 is desired, a WRITE sequence is applied to the alterable threshold array and the ROM is addressed with +2 volts. Since the alterable threshold devices cannot respond to the +2 volts in the written state, VT1= +4 volts, the upper fixed threshold transistors are selected. Thus, simply by writing or erasing all alterable threshold devices simultaneously, either memory bank can be addressed.

Figure 11:
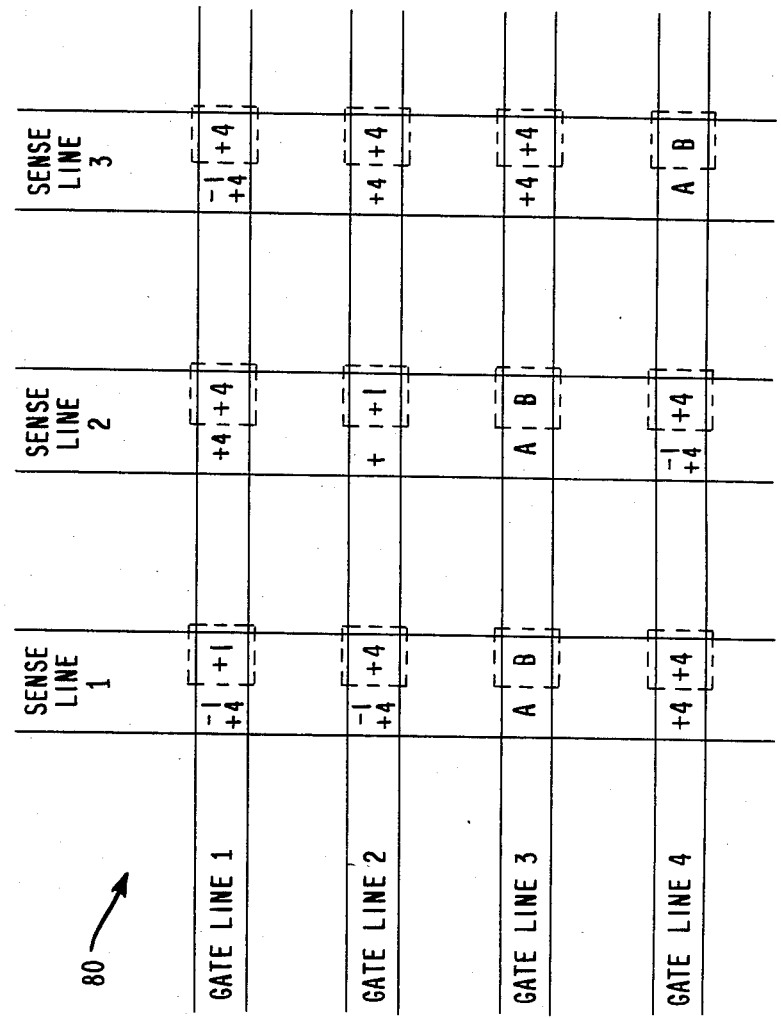
FIG. 11 schematically illustrates a memory array circuit.

The versatility of the present bit-selectable concept is further exemplified by the program selectable AND-OR ROM circuit 80 which is shown in FIG. 11. The figure illustrates the location of the NV alterable threshold devices, device location A, and the fixed threshold devices, device location B, as well as various examples of threshold voltage combinations for the devices.

For device locations A, the NV alterable threshold device location, the notation "−1, +4" indicates that an operable memory device exists at that location which is switchable between VT0 and VT1. That location is binary "1" in the NV alterable threshold code pattern. See, for example, device location A at address gate line 1-sense line 1 (i.e., address 1-1). In contrast, the notation "+4" in the A location at address 1-2 indicates there is no operable memory device at that location. Instead, device A has a fixed threshold of +4 volts. That location is binary "0" in the NV alterable threshold code pattern; the A pattern.

In fixed threshold device location B, the notation "+1" denotes the existence of an operable fixed threshold device (operable at the selected operating voltage conditions) which has an exemplary threshold of +1 volts, and binary "1". See, for example, addresses 1-1 and 2-2. Conversely, the notation "+4" at device locations B indicates an inoperable/non-existent fixed threshold device, and binary "0" in the B code pattern.

Program selection and reading are also accomplished as described previously. For example, to read location 1-1 (gate line 1, sense line 1), device location A, an erase sequence is applied to erase an operable device to VT0 (−1 volt), then the address is read by grounding the gate line 1 (0 volts) with gate lines 2-4 at +5 volts and sense line 1 at the appropriate system voltage such as +5 volts. As described previously, the READ sequence turns on an operable memory device, which is at VT0, (binary 1), but not an inoperable one (binary 0).

To illustrate the READ sequence for device location B, consider again address 1-1. Initially, a WRITE sequence is applied to device location A so that this location will not conduct. Then, a READ voltage of +2 volts, rather than 0 volts, is applied to selected gate line 1, again with +5 volts on non-selected gate lines 2-4 and with the appropriate voltage on sense line 1. For an operative fixed threshold device, $VT_f = +1$ volt, and device B conducts current, which can be sensed as binary 1. For an inoperative device B location, location B does not conduct current, representing binary "0". Of course, the same type of procedure applies for reading the A or B locations at other addresses.

Thus, there has been described preferred and alternative constructions for the present invention along with process descriptions for each structure. For instance, it is foreseeable that the alterable threshold device could be a volatile device which has been coded by the transfer of charge to the threshold altering element of the device in a cell. In this regard, it is also contemplated that the volatile alterable threshold device so coded is subject to change by selective transfers of charge. Furthermore, the particular parameters used in this patent document are intended to be illustrative only and are not intended to limit the invention. While the best known mode of operation and the best known configurational mode are described, it is clear that others of skill in the microelectronics art can improve the processes and structures based upon the disclosure herein, and that such improvements will fall within the scope and spirit of this invention as defined by the appended claims.

What is claimed is:

1. A bit selectable, two bit per cell memory device comprising:
   a first, alterable threshold memory device comprising a channel structure and a charge storage memory gate structure which includes a gate electrode and a dielectric structure between the gate electrode and the channel, the memory gate structure having charge storage capability suitable for writing the device threshold voltage to a first relatively low voltage level and a second relatively high voltage level; and
   a second fixed threshold voltage device comprising a channel structure and a gate structure which includes the gate electrode of the first device and a dielectric structure between the gate electrode and channel, the channel structure of the fixed threshold device being formed in electrical parallel relationship to the channel structure of the first device.

2. A bit selectable, two bit per cell memory device, comprising:
   a first, alterable threshold memory device comprising a channel structure and a charge storage memory gate structure which includes a gate electrode and a dielectric structure between the gate electrode and the channel, the memory gate structure having charge storage capability suitable for writing the device threshold voltage to a first relatively low voltage level and a second relatively high voltage level; and a second fixed threshold voltage device comprising a channel, which includes the channel of the alterable threshold device, a gate electrode and a dielectric structure between the gate electrode and channel, the channel structure of the fixed threshold device being formed in electrical parallel relationship to the channel structure of the first device.

3. The memory device of claims 1 or 2 wherein the memory device has a horizontally integrated structure with the first device and the second device being formed in the same active area of an integrated circuit.

4. The memory device of claims 1 or 2 wherein the memory device has a vertically integrated structure with the first device and the second device being formed in substantially horizontal planes which are situated one on the other.

5. The memory device of claim 3 wherein the first alterable threshold memory device is nonvolatile.

6. The memory device of claim 4 wherein the first alterable threshold memory device is nonvolatile.

7. A bit selectable, two bit per cell memory device, comprising:

a first, alterable threshold memory device comprising a channel structure and a charge storage memory gate structure including a gate electrode and a dielectric structure between the gate electrode and the channel for being selectably written when configured as an operable device to first relatively low and second relatively high threshold voltage states determined by the charge stored in the memory gate structure;

a second fixed threshold voltage device comprising a channel structure and a gate structure including a gate electrode and a dielectric structure formed between the gate electrode and the channel, the channel structure of the fixed threshold device being formed in electrical parallel relationship to the channel structure of the alterable threshold device and being part of the same gate electrode structure as the alterable threshold device and when configured as an operable device having a threshold voltage between the high and low threshold voltages of the first device; and means for applying a voltage between the gate electrode and channel of the first, alterable threshold device for writing the alterable threshold device to the first and second threshold voltage state to thereby select one of the alterable threshold device and the seocnd, fixed threshold device for reading.

8. A bit selectable, two bit per cell memory device, comprising:

a first, alterable threshold memory device comprising a channel structure and a charge storage memory gate structure including a gate electrode and a dielectric structure between the gate electrode and the channel for being selectably written when configured as an operable device to first relatively low and second relatively high threshold voltage states determined by the charge stored in the memory gate structure;

a second fixed threshold voltage device comprising a channel, which includes the channel of the alterable threshold device, a gate electrode and a dielectric structure formed between the gate electrode and the channel, the channel structure of the fixed threshold device being formed in electrical parallel relationship to the channel structure of the alterable threshold device and when configured as an operable device having a threshold voltage between the high and low threshold voltages of the first device; and means for applying a voltage between the gate electrode and channel of the first, alterable threshold device for writing the alterable threshold device to the first and second threshold voltage state to thereby select one of the alterable threshold device and the second, fixed threshold device for reading.

9. The bit selectable, two bit per cell memory device of claims 7 or 8, further comprising means for applying a read voltage to said device intermediate the first threshold voltage and the fixed threshold voltage for reading the logic state of the alterable threshold device in conjunction with a prior low threshold writing sequence, and for applying a read voltage to the alterable threshold device intermediate the fixed threshold and the second threshold for reading the logic state of the fixed threshold device in conjunction with application of a prior high threshold voltage writing sequence.

10. The memory device of claims 7 or 8 wherein the device has a horizontally integrated structure with the first device and the second device being formed in the same active area of an integrated circuit.

11. The memory device of claims 7 or 8 wherein the device has a vertically integrated structure with the first device and the second device being formed in substantially horizontal planes which are situated one on the other.

12. The memory device of claim 7 wherein the first alterable threshold memory device is nonvolatile.

13. The memory device of claim 8 wherein the first alterable threshold memory device is nonvolatile.

* * * * *